United States Patent
Kleine Jaeger et al.

(10) Patent No.: US 8,920,591 B2
(45) Date of Patent: Dec. 30, 2014

(54) PROCESS FOR PRODUCING ELECTRICALLY CONDUCTIVE BONDS BETWEEN SOLAR CELLS

(75) Inventors: Frank Kleine Jaeger, Bad Duerkheim (DE); Juergen Kaczun, Wachenheim (DE); Stephan Hermes, Bad Duerkheim (DE)

(73) Assignee: BASF SE, Ludwigshafen (DE)

( * ) Notice: Subject to any disclaimer, the term of this patent is extended or adjusted under 35 U.S.C. 154(b) by 49 days.

(21) Appl. No.: 13/579,718

(22) PCT Filed: Feb. 16, 2011

(86) PCT No.: PCT/IB2011/050641
§ 371 (c)(1),
(2), (4) Date: Aug. 17, 2012

(87) PCT Pub. No.: WO2011/101788
PCT Pub. Date: Aug. 25, 2011

(65) Prior Publication Data
US 2012/0312467 A1 Dec. 13, 2012

Related U.S. Application Data

(60) Provisional application No. 61/305,162, filed on Feb. 17, 2010.

(51) Int. Cl.
| | | |
|---|---|---|
| B29C 65/16 | (2006.01) | |
| H01L 31/05 | (2014.01) | |
| C09J 11/04 | (2006.01) | |
| C09J 5/00 | (2006.01) | |
| C09J 9/02 | (2006.01) | |
| C08K 3/04 | (2006.01) | |
| C08K 3/08 | (2006.01) | |

(52) U.S. Cl.
CPC ....... H01L 31/0504 (2013.01); C09J 2203/322 (2013.01); C08K 3/04 (2013.01); C08K 3/08 (2013.01); C09J 11/04 (2013.01); C09J 5/00 (2013.01); C09J 9/02 (2013.01); C09J 2205/31 (2013.01); Y02E 10/50 (2013.01)
USPC .................................................. 156/272.8

(58) Field of Classification Search
CPC ............ H01L 31/05; H01B 1/20; H01B 1/22; H01B 1/24; B32B 37/12; B32B 38/14; B29C 65/16
USPC ............................ 156/272.2, 272.8, 230, 289
See application file for complete search history.

(56) References Cited

U.S. PATENT DOCUMENTS

| 4,606,962 A  * | 8/1986  | Reylek et al. ................. 428/148 |
|---|---|---|
| 6,177,151 B1 * | 1/2001  | Chrisey et al. ................ 427/596 |
| 6,967,123 B2 * | 11/2005 | Ng et al. ....................... 438/106 |
| 2008/0169060 A1 | 7/2008 | Ho et al. |
| 2009/0288697 A1* | 11/2009 | Shimizu et al. ............... 136/244 |
| 2010/0009094 A1 | 1/2010 | Lochtman et al. |
| 2010/0021657 A1 | 1/2010 | Lochtman et al. |
| 2011/0014492 A1 | 1/2011 | Joshi et al. |
| 2011/0086231 A1 | 4/2011 | Lochtman et al. |
| 2011/0135849 A1 | 6/2011 | Kruesemann et al. |
| 2011/0151614 A1 | 6/2011 | Lochtman et al. |
| 2011/0168045 A1 | 7/2011 | Bruchmann et al. |
| 2011/0201190 A1 | 8/2011 | Hermes et al. |
| 2011/0292159 A1 | 12/2011 | Jäger et al. |
| 2011/0298878 A1 | 12/2011 | Kleine Jäger et al. |
| 2011/0310205 A1 | 12/2011 | Jäger et al. |
| 2012/0132274 A1 | 5/2012 | Kleine Jaeger et al. |
| 2012/0156391 A1 | 6/2012 | Kleine Jaeger et al. |
| 2012/0161081 A1 | 6/2012 | Kleine Jaeger et al. |
| 2012/0164777 A1 | 6/2012 | Kleine Jaeger et al. |

FOREIGN PATENT DOCUMENTS

| DE | 37 02 643 | 8/1987 |
|---|---|---|
| EP | 2 058 868 | 5/2009 |

OTHER PUBLICATIONS

International Search Report Issued Jun. 16, 2011 in PCT/IB11/050641 Filed Feb. 16, 2011.

* cited by examiner

*Primary Examiner* — Daniel McNally
(74) *Attorney, Agent, or Firm* — Oblon, Spivak, McClelland, Maier & Neustadt, L.L.P.

(57) ABSTRACT

The invention relates to a process for producing electrically conductive bonds between solar cells, in which an adhesive comprising electrically conductive particles is first transferred from a carrier to the substrate by irradiating the carrier with a laser, the adhesive transferred to the substrate is partly dried and/or cured to form an adhesive layer, in a further step the adhesive is bonded to an electrical connection, and finally the adhesive layer is cured. The invention further relates to an adhesive for performing the process, comprising 20 to 98% by weight of electrically conductive particles, 0.01 to 60% by weight of an organic binder component used as a matrix material, based in each case on the solids content of the adhesive, 0.005 to 20% by weight of absorbent based on the weight of the conductive particles in the adhesive, and 0 to 50% by weight of a dispersant and 1 to 20% by weight of solvent, based in each case on the total mass of the undried and uncured adhesive.

11 Claims, No Drawings

PROCESS FOR PRODUCING ELECTRICALLY CONDUCTIVE BONDS BETWEEN SOLAR CELLS

The invention relates to a process for producing electrically conductive bonds between solar cells, and to an adhesive for performing the process.

The process according to the invention is suitable for producing contacts on solar cells or for bonding solar cells to one another.

In the construction of photovoltaic modules, individual solar cells are currently being bonded to one another almost exclusively by soldering processes. This is described, for example, in EP-A 2 058 868. However, the process disclosed here has the disadvantage that liquid metal alloys have to be precisely positioned and metered. In the case of use of these alloys, large amounts of energy are also needed in order to liquefy the metal. Most alloys also comprise lead in order to achieve a melting point sufficiently low for the processing. In the course of cooling, cracks may also form as a result of shrinkage on the soldered contact.

A further possibility is the use of conductive adhesive films, which is likewise described in EP-A 2 058 868. Here, however, the connection and bonding to the solar cell is often unreliable. Moreover, these films are often costly and inconvenient to produce and difficult to position.

It is an object of the invention to provide a process for producing electrical contacts on solar cells, in which the electrically conductive contacts can be produced without the use of liquid metal solders, and in which exact positioning of the contact sites is possible.

The object is achieved by a process for producing electrically conductive bonds between solar cells, comprising the following steps:

(a) transferring an adhesive comprising conductive particles from a carrier to a conductive layer of a substrate by irradiating with a laser, (b) partly drying and/or curing the adhesive transferred to the substrate to form an adhesive layer, (c) bonding the adhesive to an electrical connection, (d) fully curing the adhesive transferred to the substrate.

The examples of suitable substrates to which the adhesive is applied are all rigid or flexible substrates which are suitable for the production of solar cells. Suitable substrates for production of solar cells are, for example, monocrystalline, polycrystalline or amorphous silicon, III-V semiconductors such as GaAs, GaSb, GaInP, GaInP/GaAs, GaAs/Ge, II-VI semiconductors such as CdTe, or I-III-VI semiconductors, for example $CuInS_2$, $CuGaSe_2$ or semiconductors of the general form $ABC_2$ in which A is Cu, Ag or Au, B is Al, Ga or In, and C is S, Se or Te.

Also suitable are all rigid and flexible substrates coated with the above-described semiconductors, for example glass and polymer films.

A suitable adhesive which can be used to perform the process comprises 20 to 98% by weight of electrically conductive particles, 0.01 to 60% by weight of an organic binder component used as a matrix material, based in each case on the solids content of the adhesive, 0.005 to 20% by weight of absorbent based on the weight of the conductive particles in the adhesive, and 0 to 50% by weight of a dispersant and 1 to 30% by weight of solvent, based in each case on the total mass of the undried and uncured adhesive.

Typically, contacts for electrical connection are mounted on the substrate composed of the semiconductor material. The contacts may, for example, be in the form of busbars. Typically applied for the contacts are conductor tracks composed of an electrically conductive material, especially silver, copper, nickel, aluminum and alloys thereof, and also core-shell particles.

In order to enable an electrical connection of the solar cell, the adhesive is applied to the contacts mounted on the semiconductor material.

In a first step, the adhesive comprising conductive particles is transferred from a carrier to the substrate. The transfer is effected by irradiating the adhesive on the carrier with a laser.

In one embodiment, the adhesive with the conductive particles present therein is preferably applied to the full area of the carrier before it is transferred to the substrate. Alternatively, it is of course also possible that the adhesive is applied to the carrier in a structured manner. Preference is given, however, to application over the full area.

In a further embodiment, a carrier already coated with the adhesive is used. For this purpose, it is possible, for example, that a carrier is used in the form of a film coated with the adhesive, which is wound up on a film supply. After the transfer of the adhesive, the film is collected and, for example, sent to disposal or reutilization.

Suitable carriers are all materials transparent to the particular laser radiation, for example plastic or glass. For example, in the case of use of IR lasers, it is possible to use polyolefin films, PET films, polyimide films, polyamide films, PEN films, polystyrene films or glass. Preference is given to polyimide films.

The carrier may be either rigid or flexible. In addition, the carrier may be in the form of a tubular or continuous film, or sleeve, or in the form of a flat carrier.

Suitable laser beam sources for generation of the laser beam are commercially available. It is possible in principle to utilize all laser beam sources. Such laser beam sources are, for example, pulsed or continuous gas, fiber, solid-state, diode or excimer lasers. Each of these may be used if the particular carrier is transparent to the laser radiation, and the adhesive which comprises the conductive particles and has been applied to the carrier sufficiently absorbs the laser radiation to generate a cavitation bubble in the adhesive layer as a result of conversion of light energy to thermal energy.

The wavelength of the laser beam that the laser generates is preferably within the range from 150 to 10 600 nm, especially within the range from 600 to 10 600 nm.

Preference is given to using, as the laser source, pulsed or continuous (cw) IR lasers, for example Nd:YAG lasers, Yb:YAG lasers, fiber lasers or diode lasers. These are inexpensive and available with high power. Particular preference is given to continuous (cw) IR lasers. Depending on the absorption behavior of the adhesive which comprises the conductive particles, it is, however, also possible to use lasers with wavelengths in the visible or in the UV frequency range. Suitable examples for this purpose are Ar lasers, HeNe lasers, frequency-multiplied IR solid-state lasers or excimer lasers, such as ArF lasers, KrF lasers, XeCl lasers or XeF lasers. Depending on the laser beam source, the laser power and the lens system and modulators used, the focus diameter of the laser beam is in the range between 1 μm and 100 μm. To generate the structure of the surface, it is also possible to arrange a mask in the beam path of the laser or to employ an imaging process known to those skilled in the art.

In a preferred embodiment, the desired parts of the adhesive applied to the carrier are transferred to the substrate by means of a laser focused onto the adhesive.

To perform the process according to the invention, the laser beam and/or the carrier and/or the substrate can be moved. The laser beam can be moved, for example, by a lens system known to those skilled in the art and comprising rotating mirrors. The carrier may, for example, be in the form of a rotating continuous film which is coated continuously with the adhesive comprising the electrically conductive particles. The substrate can be moved, for example, by means of an XY table or as a continuous film with unwinding and winding apparatus.

The adhesive which is transferred from the carrier to the substrate comprises the conductive particles in a matrix material. The particles may be particles of any desired geometry and composed of any desired electrically conductive material, of mixtures of different electrically conductive materials or else of mixtures of electrically conductive and nonconductive materials. Suitable electrically conductive materials are, for example, carbon such as carbon black, graphite, graphene or carbon nanotubes, or metals. Preferred metals are nickel, tin, zinc, copper, silver, gold, aluminum, titanium, palladium, platinum and alloys thereof, or metal mixtures which comprise at least one of these metals. Especially preferred as material for the conductive particles are silver, aluminum, copper, nickel, tin, zinc and carbon, and mixtures thereof.

The conductive particles preferably possess a mean particle diameter of 0.001 to 100 μm, preferably of 0.002 to 80 μm and especially preferably of 0.005 to 50 μm. The mean particle diameter can be determined by means of laser diffraction measurement, for example on a Microtrac X100 instrument. The distribution of the particle diameters depends on the production process thereof. Typically, the diameter distribution has only one maximum, though several maxima are also possible. In order to achieve a particularly tight packing of the particles, preference is given to using different particle diameters. For example, particles with a mean particle size of more than 1 μm can be blended with nanoparticles having a mean particle diameter of less than 100 nm.

The particles may alternatively also comprise a first metal and a second metal, in which case the second metal is in the form of an alloy with the first metal or one or more other metals. The particles may also comprise two different alloys.

In addition to selection of the particles, the form of the particles influences the properties of the adhesive after coating. With regard to the shape, numerous variants known to those skilled in the art are possible. The shape of the particles may, for example, be acicular, cylindrical, platelet-shaped or spherical. These particle shapes constitute idealized forms, and the actual form may vary therefrom to a greater or lesser degree, for example as a result of production. For example, droplet-shaped particles in the context of the present invention are a real deviation from the idealized sphere shape.

Suitable particles with different particle shapes are commercially available.

When mixtures of particles are used, the individual mixing partners may also have different particle shapes and/or particle sizes. It is also possible to use mixtures of only one type of particles with different particle sizes and/or particle shapes. In the case of different particle shapes and/or particle sizes, preference is likewise given to silver, aluminum, copper, nickel, tin, zinc and carbon, and mixtures thereof.

When mixtures of particle shapes are used, mixtures of spherical particles with platelet-shaped particles are preferred. In one embodiment, for example, spherical silver particles are used with platelet-shaped silver particles and/or carbon particles of other geometries. In another embodiment, spherical silver particles are combined with platelet-shaped aluminum particles.

The electrically conductive particles are more preferably composed of the same material or comprise the same materials as the contacts on the semiconductor material to which the adhesive is applied.

Based on the total weight of the dried coating, the proportion of conductive particles is in the range from 20 to 100% by weight. A preferred range of the proportion of particles is 50 to 95% by weight, based on the total weight of the dried adhesive.

Suitable matrix materials are, for example, natural and synthetic polymers and derivatives thereof, natural resins and synthetic resins and derivatives thereof, natural rubber, synthetic rubber and the like. These may—but need not—be chemically or physically curing, for example air-curing, radiation-curing or temperature-curing.

The matrix material is preferably a polymer or polymer mixture.

Polymers preferred as matrix material are acrylate resins; alkylvinyl acetates; alkylene-vinyl acetate copolymers, in particular methylene-vinyl acetate, ethylene-vinyl acetate, butylene-vinyl acetate; alkylene-vinyl chloride copolymers; amino resins; aldehyde resins and ketone resins; epoxy acrylates; epoxy resins; modified epoxy resins, e.g. bifunctional or polyfunctional bisphenol A or bisphenol F resins, epoxy-novolac resins, vinyl ethers, ethylene-acrylic acid copolymers; hydrocarbon resins; MABS (transparent ABS comprising acrylate units); melamine resins, maleic anhydride copolymers; methacrylates; natural rubber; synthetic rubber; chlorinated rubber; natural resins; phenolic resins; phenoxy resins, polyester resins, polyamides; polyimides; polybutylene terephthalate (PBT); polycarbonate (for example Makrolon® from Bayer AG); polymethyl methacrylate (PMMA); polyphenylene oxide (PPO); polyvinyl compounds, in particular polyvinyl chloride (PVC), PVC copolymers, PVdC, polyvinyl acetate and copolymers thereof, polyvinyl acetals, polyvinyl acetates, polyvinyl ethers, polyvinyl acrylates and polyvinyl methacrylates in solution and as dispersion, and also their copolymers, polyacrylates and polystyrene copolymers; polyurethanes, uncrosslinked or crosslinked with isocyanates; polyurethane acrylates; 1- and 2-component silicone resins and silicone rubbers, styrene-acrylic copolymers; styrene-butadiene block copolymers (for example Styroflex® or Styrolux® from BASF AG, K-Resin™ from CPC); SIS; triazine resin, bismaleimide-triazine resin (BT), cyanate ester resin (CE). Mixtures of two or more polymers can also form the matrix material.

Polymers particularly preferred as matrix material are acrylates, acrylate resins, methacrylates, methacrylate resins, melamine and amino resins, polyimides, epoxy resins, modified epoxy resins, polyvinyl ethers, phenolic resins, polyurethanes, polyesters, polyvinyl acetals, polyvinyl acetates, polystyrene copolymers, polystyrene acrylates, styrene-butadiene block copolymers, styrene-isoprene block copolymers, synthetic rubber, phenoxy resins, alkylene-vinyl acetates and vinyl chloride copolymers, polyamides, and also their copolymers, and also silicone rubbers and silicone resins.

Based on the total weight of the dry adhesive, the proportion of the organic binder component used as the matrix material is 0.01 to 60% by weight. The proportion is preferably 0.1 to 45% by weight, more preferably 0.5 to 35% by weight.

In order to be able to apply the adhesive comprising the conductive particles and the matrix material to the carrier, a solvent or a solvent mixture may additionally be added to the adhesive, in order to establish the viscosity suitable for the particular application process in the adhesive. Suitable solvents are, for example, aliphatic and aromatic hydrocarbons (for example n-octane, cyclohexane, toluene, xylene), alcohols (for example methanol, ethanol, 1-propanol, 2-propanol, 1-butanol, 2-butanol, 3-methylbutanol amyl alcohol), polyhydric alcohols such as glycerol, ethylene glycol, propylene glycol, neopentyl glycol, alkyl esters (for example methyl acetate, ethyl acetate, propyl acetate, butyl acetate, isobutyl acetate, isopropyl acetate), alkoxy alcohols (for example methoxypropanol, methoxybutanol, ethoxypropanol), alkylbenzenes (for example ethylbenzene, isopropylbenzene), butylglycol, butyldiglycol, alkylglycol acetates (for example butylglycol acetate, butyldiglycol acetate, propylene glycol methyl ether acetate), diacetone alcohol, diglycol dialkyl ethers, diglycol monoalkyl ethers, dipropylene glycol dialkyl ethers, dipropylene glycol monoalkyl ethers, diglycol alkyl ether acetates, dipropylene glycol alkyl ether acetates, dioxane, dipropylene glycol and ethers, diethylene glycol and ethers, DBE (dibasic esters), 2,2,4-trimethyl-1,3-pentanediol monoisobutyrate, ethers (for example diethyl ether, tetrahydrofuran), ethylene chloride, ethylene glycol, ethylene glycol acetate, ethylene glycol dimethyl ester, cresol, lactones (for example butyrolactone), ketones (for example acetone, 2-butanone, cyclohexanone, methyl ethyl ketone (MEK), methyl isobutyl ketone (MIBK)), methyldiglycol, methylene chloride, methylene glycol, methylglycol acetate, methylphenol (ortho-, meta-, para-cresol), pyrrolidones (for example N-methyl-2-pyrrolidone), propylene glycol, propylene carbonate, carbon tetrachloride, toluene, trimethylolpropane (TMP), aromatic hydrocarbons and mixtures, aliphatic hydrocarbons and mixtures, alcoholic monoterpenes (for example terpineol), water and mixtures of two or more of these solvents.

Preferred solvents are alcohols (for example ethanol, 1-propanol, 2-propanol, butanol), alkoxy alcohols (for example methoxypropanol, ethoxypropanol, butylglycol, butyldiglycol), butyrolactone, diglycol dialkyl ethers, diglycol monoalkyl ethers, dipropylene glycol dialkyl ethers, dipropylene glycol monoalkyl ethers, esters (for example ethyl acetate, butyl acetate, butyl glycol acetate, butyldiglycol acetate, diglycol alkyl ether acetates, dipropylene glycol alkyl ether acetates, DBE, propylene glycol methyl ether acetate, 2,2,4-trimethyl-1,3-pentanediol monoisobutyrate), ethers (for example tetrahydrofuran, dioxane), polyhydric alcohols such as glycerol, ethylene glycol, propylene glycol, neopentyl glycol, ketones (for example acetone, methyl ethyl ketone, methyl isobutyl ketone, cyclohexanone), hydrocarbons (for example cyclohexane, ethylbenzene, toluene, xylene), N-methyl-2-pyrrolidone, water and mixtures thereof.

In the case of liquid matrix materials, the particular viscosity can alternatively also be established via the temperature in the course of application, or via a combination of solvent and temperature.

The proportion of solvent in the adhesive is within the range from 1 to 50% by weight, preferably within the range from 2 to 20% by weight and especially within the range from 5 to 15% by weight, based in each case on the total mass of the undried and uncured adhesive.

The adhesive may further comprise a dispersant component. This consists of one or more dispersants.

In principle, all dispersants which are known to those skilled in the art for use in dispersions and are described in the prior art are suitable. Preferred dispersants are surfactants or surfactant mixtures, for example anionic, cationic, amphoteric or nonionic surfactants. Cationic and anionic surfactants are described, for example, in "Encyclopedia of Polymer Science and Technology", J. Wiley & Sons (1966), volume 5, pages 816 to 818, and in "Emulsion Polymerisation and Emulsion Polymers", editors: P. Lovell and M. El-Asser, Verlag Wiley & Sons (1997), pages 224 to 226. However, it is also possible to use, as dispersants, polymers which have anchor groups with pigment affinity and are known to those skilled in the art.

The dispersant may, based on the total weight of the undried and uncured adhesive, be used within the range from 0 to 50% by weight. The proportion is preferably 0.1 to 25% by weight, more preferably 0.2 to 10% by weight.

If the conductive particles in the adhesive on the carrier do not themselves sufficiently absorb the energy of the energy source, for example of the laser, absorbents can be added to the adhesive. According to the laser beam source used, it may be necessary to select different absorbents or else mixtures of absorbents which effectively absorb the laser radiation. The absorbent is either added to the adhesive or an additional separate absorption layer which comprises the absorbent is applied between the carrier and the adhesive. In the latter case, the energy is absorbed locally in the absorption layer and transferred to the adhesive by thermal conduction.

Suitable absorbents for laser radiation have a high absorption in the region of the laser wavelength. Especially suitable are absorbents which have a high absorption in the near infrared and in the longer-wave VIS region of the electromagnetic spectrum. Such absorbents are suitable especially for absorbing the radiation from high-power solid-state lasers, for example Nd:YAG lasers, and also from IR diode lasers. Examples of suitable absorbents for the laser radiation are dyes which absorb strongly in the infrared spectral region, for example phthalocyanines, naphthalocyanines, cyanines, quinones, metal complex dyes, such as dithiolenes, or photochromic dyes.

In addition, suitable absorbents are inorganic pigments, especially intensively colored inorganic pigments such as chromium oxides, iron oxides, iron oxide hydrates, or carbon in the form of, for example, carbon black, graphite, graphenes or carbon nanotubes.

In addition to the aforementioned absorbents, it is also possible to use nanoparticles, especially metallic nanoparticles, as absorbents.

Nanoparticles in the context of the present invention are understood to mean particles having a particle size in the range from 1 to 800 nm. Nanoparticles used as absorbents typically have a particle size in the range from 3 to 800 nm.

Nanoparticles which can be used as absorbents for laser radiation are especially nanoparticles of silver, gold, platinum, palladium, tungsten, nickel, tin, iron, indium tin oxide, tungsten oxide, titanium carbide or titanium nitride.

One advantage of the use of silver, gold, platinum, palladium, tungsten, nickel, tin, iron, indium tin oxide or titanium carbide is that these materials are electrically conductive. The nanoparticles thus additionally serve as electrically conductive particles, such that the conductivity of the adhesive is improved compared to an adhesive comprising electrically nonconductive absorbent.

A particularly preferred material for the nanoparticles is silver.

In one embodiment, the nanoparticles are spherical particles. Spherical particles in the context of the present invention means that the particles are essentially in spherical form, but the real particles may also have deviations from the ideal spherical form. For instance, the real particles may, for example, also be truncated or have a droplet shape. Other deviations from the ideal spherical shape, which can occur as a result of production, are also possible.

When the nanoparticles are spherical particles, they preferably have a diameter in the range from 2 to 100 nm. Especially in the case of use of infrared lasers, especially those with a wavelength of 1050 nm, it has been found that spherical nanoparticles with a particle diameter in the range from 2 to 50 nm are particularly suitable. The diameter of the spherical particles is more preferably in the region of 6 nm.

When the nanoparticles are used in the form of spherical particles, the proportion of the nanoparticles in the adhesive is especially in the range from 0.5 to 12% by weight, based on the weight of the electrically conductive particles in the adhesive.

In an alternative embodiment, the nanoparticles are prisms with an edge length in the range from 15 to 1000 nm and a height of 3 to 100 nm. The form of the prisms is variable. For instance, the form depends, among other factors, on the laser radiation used. The base of the prisms may, for example, be in the form of any polygon, for example of a triangle or of a pentagon. The prisms used as nanoparticles are generally plasmon resonators whose absorption behavior is matched to the wavelength of the laser used. The matching to the wavelength of the laser used is effected, for example, by the edge length of the prisms and by the cross-sectional area. For example, different cross-sectional areas and different edge lengths each have a different absorption behavior. The height of the prisms also exerts an influence on the absorption behavior.

When prisms are used as nanoparticles, the proportion of the nanoparticles present in the form of prisms in the adhesive is preferably in the range from 3 to 10% by weight, based on the weight of the electrically conductive particles in the adhesive.

In addition to the use of spherical particles or prisms as absorbents for laser radiation, it is alternatively also possible that both spherical particles and prisms are used. Any desired ratio of spherical particles to prisms is possible. The greater the proportion of nanoparticles in the form of prisms, the lower the proportion of nanoparticles in the adhesive may be.

The nanoparticles are generally stabilized in the course of production, especially for transport, by suitable additives. In the course of preparation of the adhesive, the additives are typically not removed, such that they are then also present in the adhesive. The proportion of additives for stabilization is generally not more than 15% by weight, based on the mass of nanoparticles. The additives used to stabilize the nanoparticles may, for example, be long-chain amines, for example dodecylamine. Further additives suitable for stabilizing the nanoparticles are, for example, octylamine, decylamine, oleic acid and polyethyleneimines.

Particularly suitable absorbents for laser radiation are finely divided carbon types and finely divided lanthanum hexaboride ($LaB_6$), and also metallic nanoparticles.

In general, 0.005 to 20% by weight of absorbents based on the weight of the conductive particles in the adhesive are used. Preference is given to using 0.01 to 15% by weight of absorbents and particular preference to using 0.1 to 12% by weight of absorbents, based in each case on the weight of the conductive particles in the adhesive.

The amount of the absorbent added is selected by the person skilled in the art according to the properties of the adhesive layer desired in each case. In this connection, the person skilled in the art will also take into account that the absorbents added influence not only the speed and efficiency of the transfer of the adhesive by means of the laser, but also other properties, for example the adhesion of the adhesive on the carrier, the curing or the electrical conductivity.

The energy which is required to transfer the adhesive comprising particles can, depending on the laser used and/or the material from which the carrier has been produced, be applied either on the side coated with the adhesive or on the opposite side to the adhesive. If required, it is also possible to use a combination of the two process variants.

The transfer of the fractions of the adhesive from the carrier to the substrate can be carried out either on one side or two sides. In this case, the transfer may involve the two sides being coated with the adhesive successively or else, for example, simultaneously from both sides by using two laser sources and two carriers coated with the adhesive.

In order to increase the productivity, it is possible to use more than one laser source.

In a preferred embodiment of the process according to the invention, the transfer of the adhesive from the carrier to the substrate is preceded by applying the adhesive to the carrier. The application is effected, for example, by a coating process known to those skilled in the art. Such coating processes are, for example, casting, such as curtain casting, roller coating, spreading, knifecoating, brushing, spraying, dipping or the like. Alternatively, the adhesive comprising particles is printed onto the carrier by any desired printing process. The printing process by which the adhesive is printed on is, for example, a roller or arc printing process, for example screen-printing, gravure printing, flexographic printing, letterpress printing, pad printing, inkjet printing, offset printing. However, any further printing process known to those skilled in the art is also usable.

In a preferred embodiment, the adhesive is not dried and/or cured completely on the carrier, but rather transferred to the substrate in the wet state. This enables, for example, the use of a continuous printing unit, in which the adhesive on the carrier can be renewed constantly. This process regime allows a very high productivity to be achieved. Printing units which are replenished continuously with ink are known to those skilled in the art, for example from DE-A 37 02 643. In order to prevent particles from sedimenting out of the adhesive, it is preferred when the adhesive is stirred and/or pumped in circulation in a reservoir vessel before being applied to the carrier. In addition, it is preferred for establishment of the viscosity of the adhesive when the temperature of the reservoir vessel in which the adhesive is present can be controlled.

In a preferred embodiment, the carrier is configured as a continuous belt which is transparent for the particular laser radiation, which is moved, for example, with internal transport rollers. Alternatively, it is possible to design the carrier as a cylinder, the cylinder being movable by means of internal transport rollers or being driven directly. The carrier is then coated with the adhesive comprising the particles, for example, by a process known to those skilled in the art, for example with a roller or a roller system from a reservoir vessel in which the adhesive is present. Rotation of the roller or of the roller system takes up the adhesive which is applied to the carrier. Movement of the carrier past the coating roller applies a full-area adhesive layer to the carrier. In order to transfer the adhesive to the substrate, the laser beam source is arranged in the interior of the continuous belt or of the cylinder. To transfer the adhesive, the laser beam is focused onto the adhesive layer and, through the carrier which is transparent to the laser beam, hits the adhesive and transfers the adhesive to the substrate at the site at which it hits the adhesive. Such a printing unit is described, for example, in DE-A 37 02 643. The adhesive is transferred, for example, by virtue of the energy of the laser beam at least partly evaporating the solvent of the adhesive and by virtue of the gas bubble which forms transferring the adhesive. The adhesive which is not transferred from the carrier to the substrate can be reused in a next coating step.

The layer thickness of the adhesive layer which is transferred to the substrate by means of the transfer by virtue of the laser varies preferably within the range between 0.01 and 50 µm, further preferably between 0.05 and 30 µm and especially preferably between 0.1 and 20 μm. The adhesive layer may be applied either over the whole surface or in a structured manner.

Structured application of the adhesive to the carrier is advantageous when particular structures are to be produced in high numbers and the structured application reduces the amount of adhesive which has to be applied to the carrier. This allows less expensive production to be achieved.

In order to obtain a mechanically stable, structured or full-area adhesive layer on the substrate, it is preferred that the adhesive with which the structured or full-area adhesive layer is applied to the substrate is dried physically or cured after the application. Depending on the matrix material, the drying or the curing is effected, for example, by the action of heat, light (UV/vis) and/or radiation, for example infrared radiation, electron beams, gamma radiation, x-radiation, microwaves. To induce the curing reaction, it may be necessary to add a suitable activator. The curing can also be achieved by combining various processes, for example by combining UV radiation and heat. The combination of the curing processes can be performed simultaneously or successively. For example, UV or IR radiation can initially be used merely to partially cure or partially dry the layer, such that the structures formed no longer flow away. Thereafter, the layer can be cured or dried further by the action of heat.

The process according to the invention for structured application of an electrically conductive adhesive to a substrate can be operated in continuous, semicontinuous or batchwise mode. It is also possible that only individual steps of the process are performed continuously, while other steps are performed batchwise.

In addition to the production of a structured surface, it is also possible by the process according to the invention to successively apply a plurality of layers to the substrate. For example, the performance of the process for producing the first conductive surface may be followed by a printing process as described above to apply a second structured or full-area conductive surface, for example with another composition of electrically conductive particles.

In a third step, the adhesive is bonded to an electrical connection. The electrical connection serves to connect a plurality of solar cells to form a photovoltaic module. The electrical connections used are, for example, connection wires. Typically, contacts on the front side of a solar cell are connected in each case to contacts on the rear side of an adjacent solar cell. However, any other electrical connection suitable for connection of solar cells is also possible.

After the bonding of the adhesive to the electrical connection, the adhesive is cured fully. This achieves a stable and permanent bond of the electrical connection to the contact of the solar cell. The complete curing is effected, as described above, for example by the action of light, heat or radiation.

The invention claimed is:

1. A process for producing an electrically conductive bond between solar cells, the process comprising:
   transferring an adhesive comprising electrically conductive particles from a carrier to a substrate by irradiating the carrier with a laser,
   partly drying, curing, or both drying and curing the adhesive transferred to the substrate to form an adhesive layer,
   bonding the adhesive to an electrical connection, and
   curing the adhesive layer.

2. The process of claim 1, further comprising:
   applying the adhesive to the carrier before the transferring.

3. The process of claim 2, wherein the laser generates a laser beam having a wavelength of from 150 to 10,600 nm.

4. The process of claim 2, wherein the applying comprises a coating process.

5. The process of claim 4, wherein the laser generates a laser beam having a wavelength of from 150 to 10,600 nm.

6. The process of claim 4, wherein the coating process is a printing, casting, rolling, or spraying process.

7. The process of claim 6, wherein the laser generates a laser beam having a wavelength of from 150 to 10,600 nm.

8. The process of claim 1, wherein the laser generates a laser beam having a wavelength of from 150 to 10,600 nm.

9. The process of claim 1, wherein the laser is a solid-state laser, a fiber laser, a diode laser, a gas laser, or an excimer laser.

10. The process of claim 1, comprising applying the adhesive to both a top side and a bottom side of the substrate to form the adhesive layer.

11. The process of claim 1, wherein the carrier is a rigid or flexible plastic or glass that is transparent to a radiation of the laser.

* * * * *